(12) United States Patent
Xiao

(10) Patent No.: US 10,892,277 B2
(45) Date of Patent: Jan. 12, 2021

(54) HIGH-κ DIELECTRIC LAYER IN THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventor: Li Hong Xiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/402,915

(22) Filed: May 3, 2019

(65) Prior Publication Data
US 2020/0303399 A1    Sep. 24, 2020

Related U.S. Application Data

(63) Continuation of application No. PCT/CN2019/078489, filed on Mar. 18, 2019.

(51) Int. Cl.
*H01L 27/11582* (2017.01)
*H01L 21/28* (2006.01)
(Continued)

(52) U.S. Cl.
CPC .... *H01L 27/11582* (2013.01); *H01L 21/0228* (2013.01); *H01L 21/31111* (2013.01);
(Continued)

(58) Field of Classification Search
CPC ......... H01L 27/11582; H01L 29/40117; H01L 21/76897; H01L 21/0228; H01L 23/53295;
(Continued)

(56) References Cited

U.S. PATENT DOCUMENTS 6,528,373 B2 * 3/2003 Lipkin ................. H01L 21/045
                                                       438/287
9,515,086 B2 * 12/2016 Yon ................... H01L 27/11582
(Continued)

FOREIGN PATENT DOCUMENTS

CN   104520992 A   4/2015
CN   107527920 A   12/2017
(Continued)

OTHER PUBLICATIONS

International Search Report issued in corresponding International Application No. PCT/CN2019/078489, dated Dec. 18, 2019, 5 pages.
(Continued)

*Primary Examiner* — Vu A Vu
(74) *Attorney, Agent, or Firm* — Bayes PLLC

(57) ABSTRACT

Embodiments of 3D memory devices having one or more high-κ dielectric layers and methods for forming the same are disclosed. In an example, a 3D memory device includes a substrate, a memory stack including a high-κ dielectric layer above the substrate and a plurality of interleaved conductor and dielectric layers above the high-κ dielectric layer, and a semiconductor plug disposed above the substrate and in an opening of the high-κ dielectric layer.

21 Claims, 12 Drawing Sheets

(51) Int. Cl.
 *H01L 21/02*  (2006.01)
 *H01L 21/311*  (2006.01)
 *H01L 21/768*  (2006.01)
 *H01L 23/532*  (2006.01)
 *H01L 27/1157*  (2017.01)

(52) U.S. Cl.
 CPC .. *H01L 21/76802* (2013.01); *H01L 21/76897* (2013.01); *H01L 23/53295* (2013.01); *H01L 27/1157* (2013.01); *H01L 29/40117* (2019.08)

(58) Field of Classification Search
 CPC ......... H01L 21/76802; H01L 21/31111; H01L 27/1157
 USPC ........................................................ 257/324
 See application file for complete search history.

(56) References Cited

U.S. PATENT DOCUMENTS 9,793,124 B2 * 10/2017 Hopkins ............. H01L 29/7889
2009/0294877 A1 * 12/2009 Tsutsui ................ H01L 29/4958
                  257/411
2013/0292835 A1 * 11/2013 King ................... H01L 21/7682
                  257/741
2017/0154892 A1 * 6/2017 Oh ...................... H01L 27/1052
2018/0350830 A1 * 12/2018 Lim .................... H01L 29/1037

FOREIGN PATENT DOCUMENTS

| CN | 108565266 A | 9/2018 |
|---|---|---|
| CN | 109075174 A | 12/2018 |
| CN | 109196645 A | 1/2019 |
| CN | 109417072 A | 3/2019 |

OTHER PUBLICATIONS

Written Opinion of the International Searching Authority issued in corresponding International Application No. PCT/CN2019/078489, dated Dec. 18, 2019, 4 pages.

\* cited by examiner

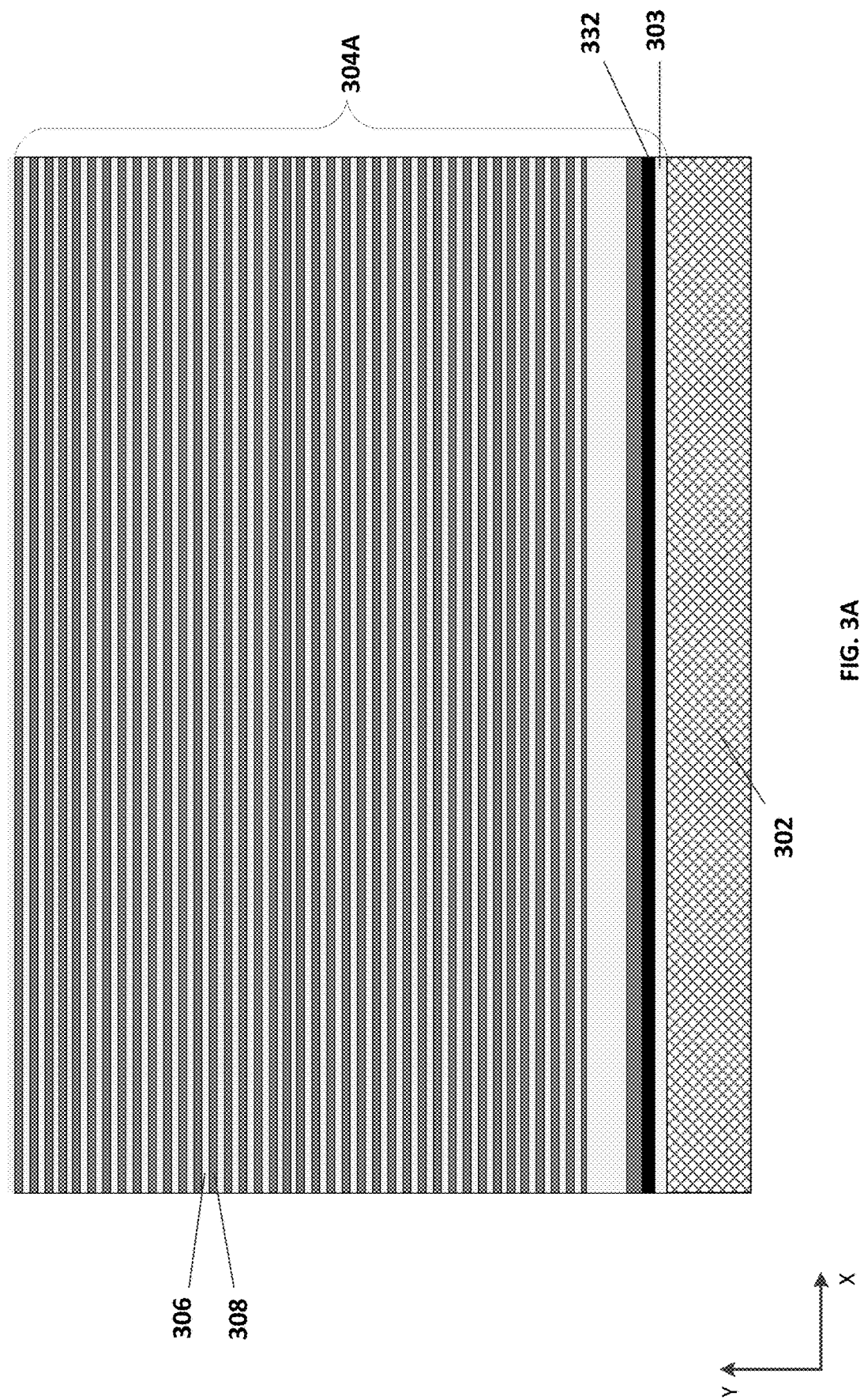

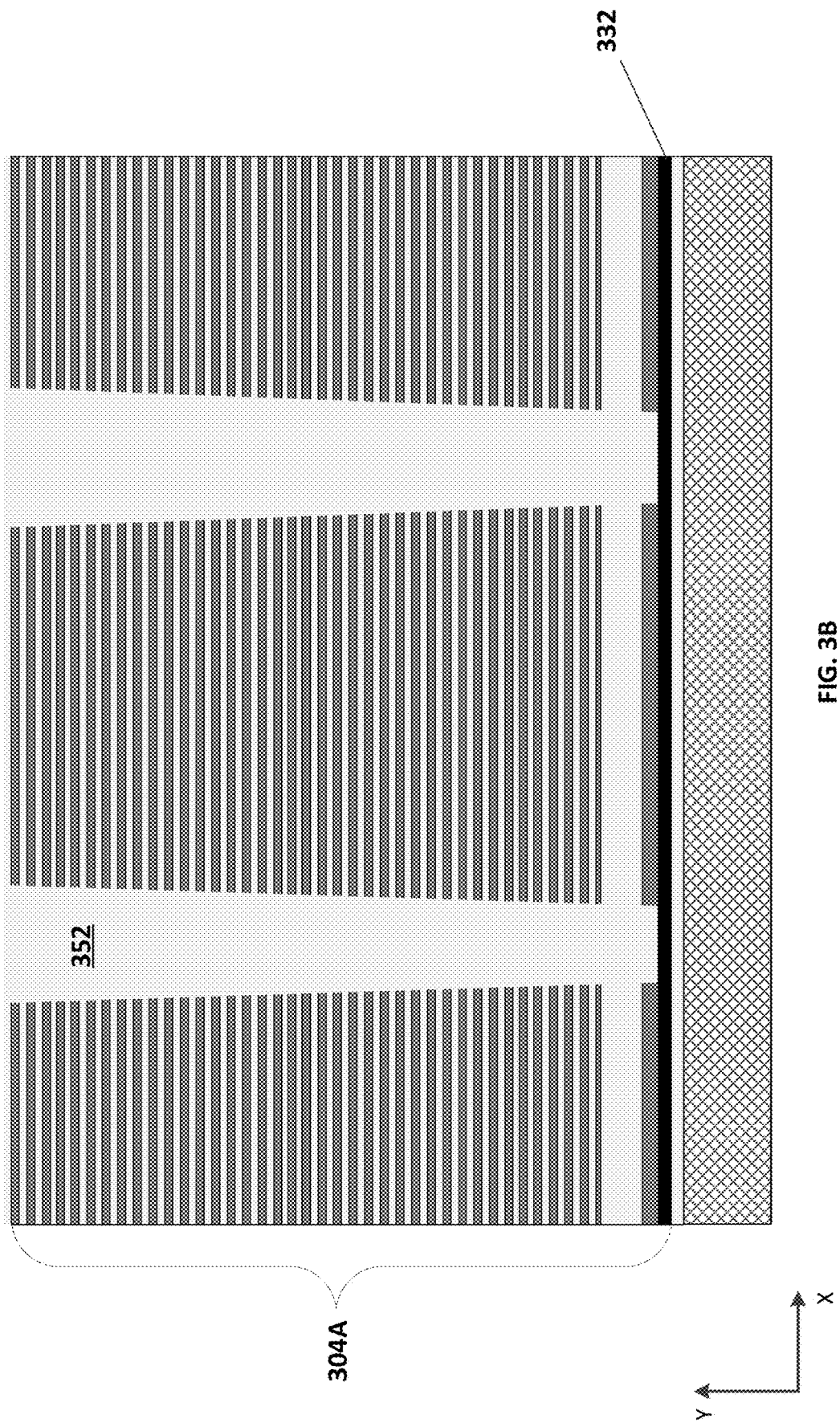

HIGH-κ DIELECTRIC LAYER IN THREE-DIMENSIONAL MEMORY DEVICES AND METHODS FOR FORMING THE SAME

CROSS REFERENCE TO RELATED APPLICATION

This application is continuation of International Application No. PCT/CN2019/078489, filed on Mar. 18, 2019, entitled "HIGH-K DIELECTRIC LAYER IN THREE-DIMENSIONAL MEMORY DEVICES AND METHODS FOR FORMING THE SAME," which is hereby incorporated by reference in its entirety.

BACKGROUND

Embodiments of the present disclosure relate to three-dimensional (3D) memory devices and fabrication methods thereof, particularly with respect to a high-κ dielectric layer in 3D memory devices and fabrications thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array. It has the advantage of occupying less wafer area than the planar memory sells for the same bit density. The memory string in the 3D memory architecture differs from that in the planar memory sells in that the string is arranged vertically above the substrate.

However, as the cell size continues to shrink, various issues arise with respect to the cost, reliability, and performance of the existing 3D memory structure and manufacturing method. Thus, novel 3D memory device and fabrication methods thereof are needed to resolve these issues.

SUMMARY

Embodiments of 3D memory devices having one or more high-κ dielectric layers and methods for forming the same are disclosed herein.

In one example, a 3D memory device includes a substrate, a memory deck including a first high-κ dielectric layer above the substrate and a first plurality of interleaved conductor layers and dielectric layers above the first high-κ dielectric layer, and a semiconductor plug disposed above the substrate and in an opening of the first high-κ dielectric layer.

In another example, a method for forming a 3D memory device is disclosed. A first dielectric deck including a first high-κ dielectric layer above a substrate and a first plurality of interleaved sacrificial layers and dielectric layers above the first high-κ dielectric layer is formed above the substrate. A first opening in the first dielectric deck extending vertically through the first dielectric deck is formed. A first hole in the first memory film and the first semiconductor channel at the bottom of the first opening is formed, and the first hole exposes the first high-κ dielectric layer. A portion of the first high-κ dielectric layer exposed to the first hole is removed. A first semiconductor plug is formed in the first hole. A channel plug is formed at the upper end of the first opening, and the channel plug contacts the first semiconductor channel. The sacrificial layers are replaced with conductor layers.

In still another example, a 3D memory device includes a substrate, a first memory deck above the substrate having a first plurality of interleaved conductor layers and dielectric layers and a first channel structure, a high-κ dielectric layer above the first memory deck, a second memory deck above the high-κ dielectric layer having a second plurality of interleaved conductor layers and dielectric layers and a second channel structure, and a semiconductor plug disposed at least partially in an opening of the high-κ dielectric layer and between the first memory deck and the second memory deck.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 3A-3H illustrate an exemplary fabrication process for forming a 3D memory device having one or more high-κ dielectric layers, according to some embodiments of the present disclosure.

Figure 1A:
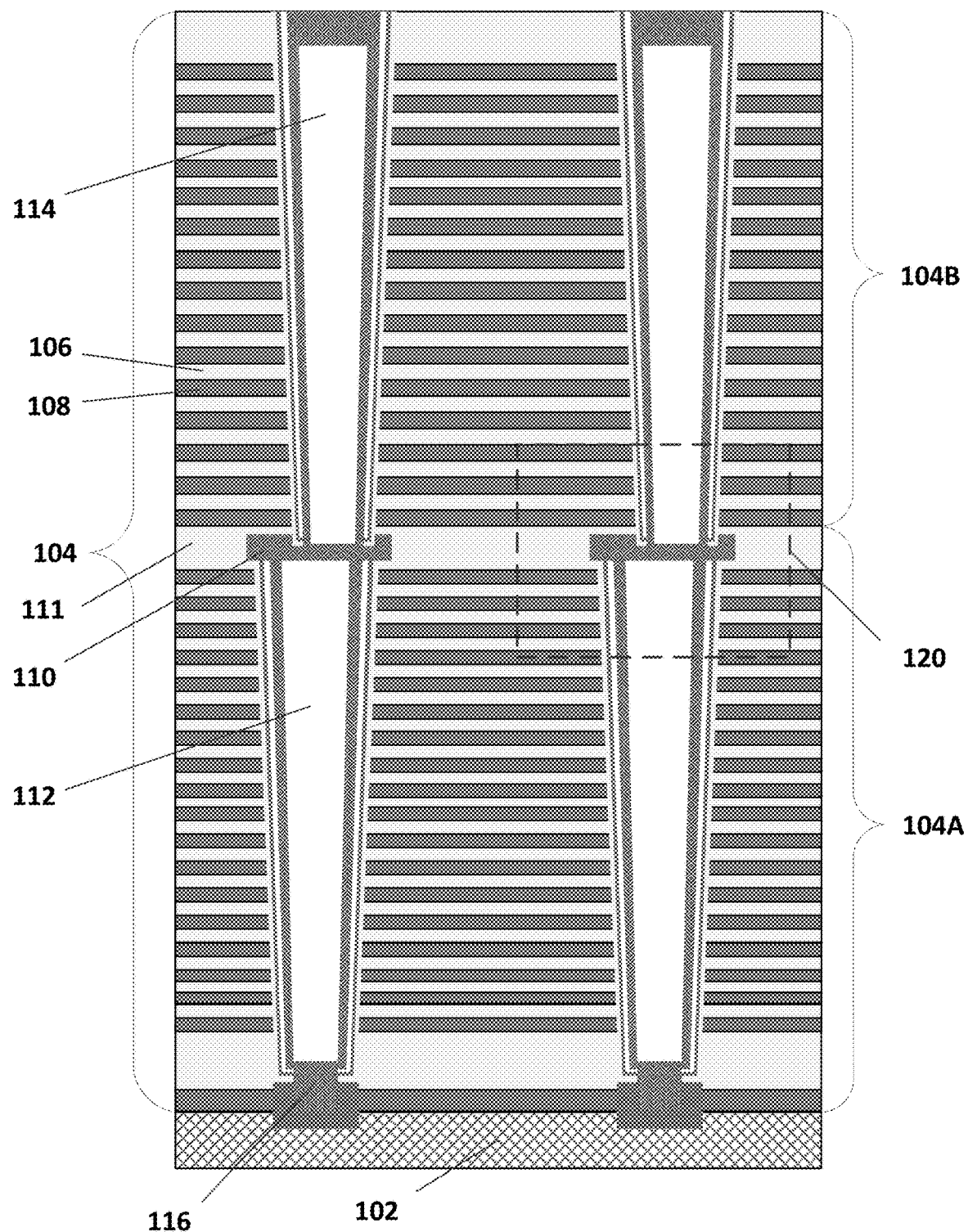
FIG. 1A illustrates a cross-section view of an existing 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," "other embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure, or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In fabricating 3D NAND memory devices with advanced technologies, such as having 96 or more levels, a dual-deck architecture is usually used, which includes two stacked channel structures that can be electrically connected by an inter-deck plug structure. The known structure of inter-deck plugs, however, encounters significant issues with respect to thickness and uniformity control.

FIG. 1A illustrates a cross-section view of an existing 3D memory device 100 having two adjacent 3D memory strings extending vertically through a dual-deck memory stack 104 (including a lower memory deck 104A and an upper memory deck 104B). Each of lower and upper memory decks 104A and 104B includes a plurality of pairs each including a conductor layer 106 and a dielectric layer 108 formed above a substrate 102. A semiconductor plug 116 is partially embedded in substrate 102. Semiconductor plug 116 and substrate 102 use the same single crystalline silicon material so it is formed by Selective Epitaxial Growth (SEG) process from substrate 102 upwards. Semiconductor plug 116 electrically connects to a lower semiconductor channel 112. A silicon-based inter-deck plug 110 is provided in a joint oxide layer 113 between lower memory deck 104A and upper memory deck 104B. Inter-deck plug 110 electrically connects lower semiconductor channel 112 with an upper semiconductor channel 114 through contact with both channels.

Figure 1B:
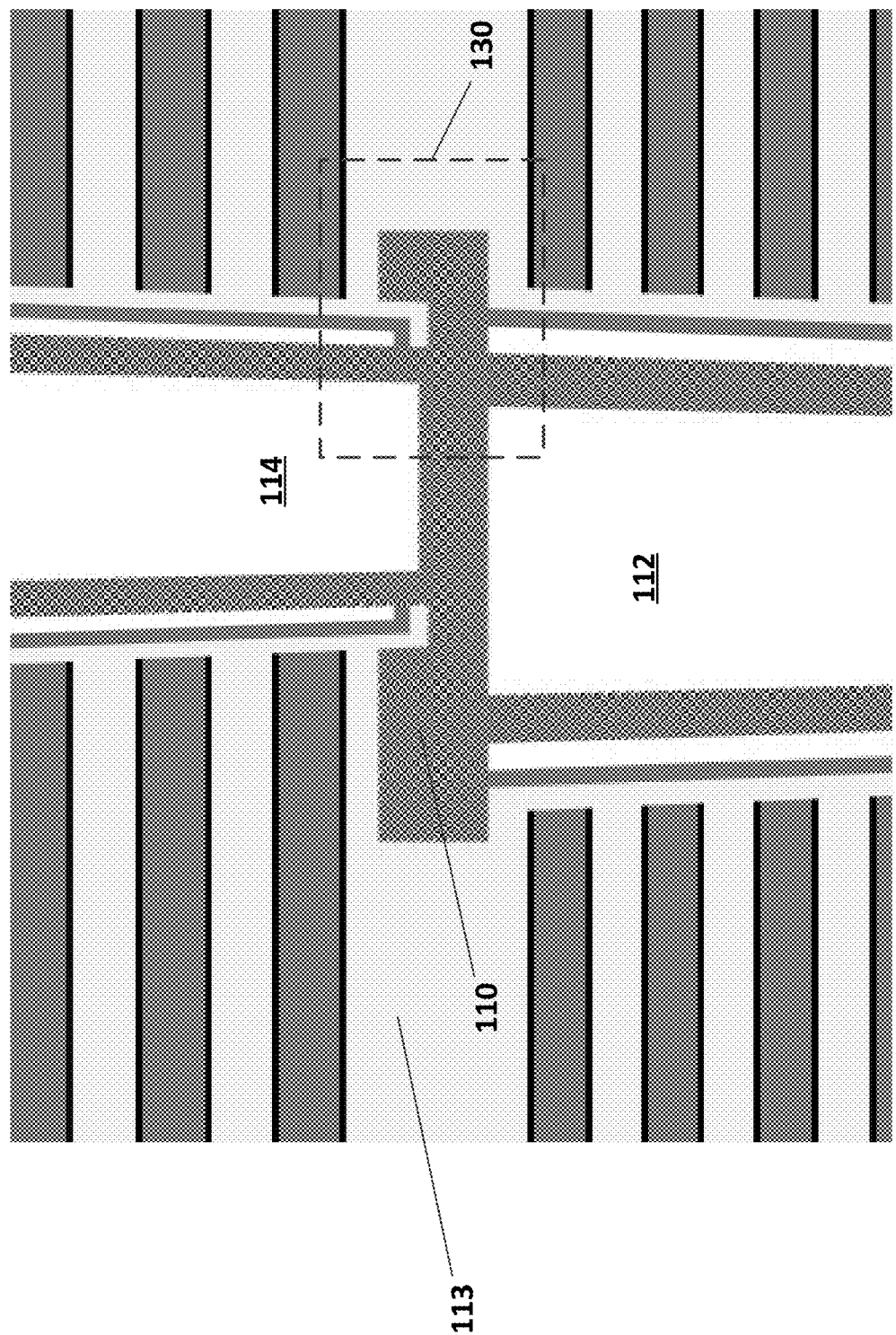
FIG. 1B illustrates an enlarged cross-section view of an area around the inter-deck plug in FIG. 1A.

FIG. 1B illustrates an enlarged cross-section view of an area 120 around the inter-deck plug in FIG. 1A. As seen from FIG. 1B, a right portion 130 of inter-deck plug 110 has a narrower protrusion than a left portion on the opposite end of inter-deck plug 110. This may be caused by ineffective etch stop control in the existing technology, such as a deviation of the photoresist layer from the intended area prior to etching, or damage to the inter-deck plug during the upper channel etching. Electrons passing through inter-deck plug 110 between lower semiconductor channel 112 and upper semiconductor channel 114 are more susceptible to leakage in this narrower-than-usual portion 130. Leakage in semiconductor devices refers to a quantum phenomenon where charge carrier tunnel through an insulating region, thereby causing increased power consumption or even complete circuit failure. On the other hand, electrons passing through the left portion of inter-deck plug 110 take a longer route that reduces the amount of current flowing between the two semiconductor channels, thus causing a current drop that hampers performance of 3D memory device 100.

Furthermore, since joint oxide layer 113 in which inter-deck plug 110 is provided does not have etch stop capability, control of etching after formation of inter-deck plug 110 is required during the subsequent fabrication of memory device 100 to avoid etching through inter-deck plug 110. This etching control process is also known as "gouging."

Various embodiments in accordance with the present disclosure provide a novel and advantageous structure using a high-κ dielectric layer as an etch stop layer in 3D memory devices and a method for fabricating the same. The structure and fabrication method may decrease the leakage of electrons at the semiconductor plug and inter-deck plug, improve the electrical connection between the substrate and the lower deck of memory string and between upper and lower decks of the memory string, reduce the damage to the plugs during channel etching, and saving costs by getting rid of the gouging and SEG processes with respect to plug formation.

Figure 2:
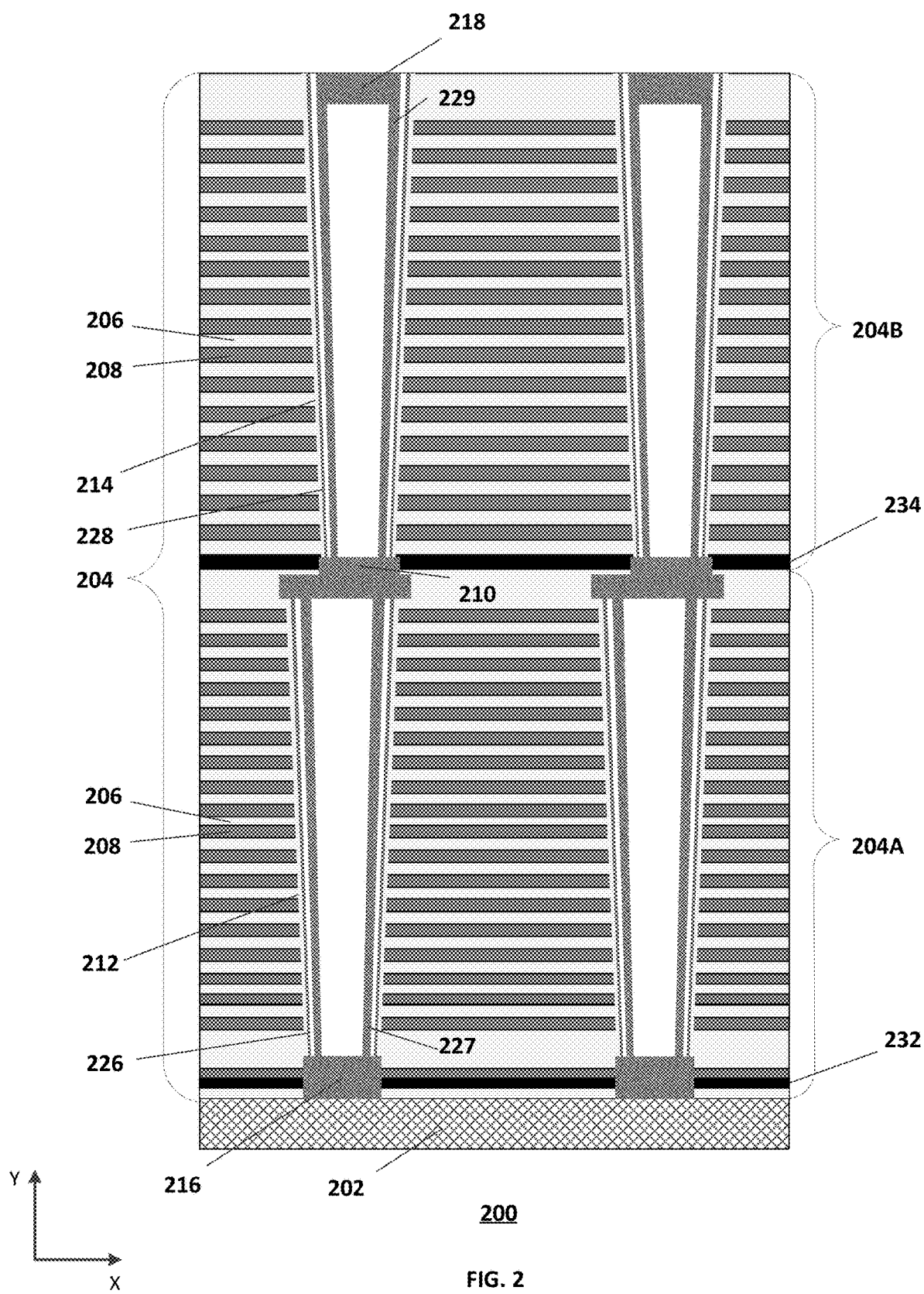
FIG. 2 illustrates a cross-section view of an exemplary 3D memory device having one or more high-κ dielectric layers, according to some embodiments of the present disclosure.

FIG. 2 illustrates a cross-section view of an exemplary 3D memory device 200, according to some embodiments of the present disclosure. 3D memory device 200 in FIG. 2 may include a substrate 202, which may include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x and y axes are included in FIG. 2 to further illustrate the spatial relationship of the components in 3D memory device 200. Substrate 202 of 3D memory device 200 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 200) is determined relative to the substrate of the 3D memory device (e.g., substrate 202) in the y-direction (i.e., the vertical direction) when the substrate is positioned in the lowest plane of the 3D memory device in the y-direction. The same notion for describing spatial relationship is applied throughout the present disclosure.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, as shown in FIG. 2, 3D memory device 200 is a NAND flash memory device having memory cells provided in the form of array of NAND memory string extending vertically above substrate 202 through a dual-deck memory stack 204. As shown in FIG. 2, the memory string may include a lower channel structure 212 and an upper channel structure 214. Each of lower and upper channel structures 212 and 214 can have a cylinder shape (e.g., a pillar shape). Memory stack 204 includes a lower memory deck 204A and an upper memory deck 204B. Lower channel structure 212 is positioned in, and extends vertically through, lower memory deck 204A while upper channel structure 214 is positioned in, and extends vertically through, upper memory deck 204B. Each of lower and upper channel structures 212 and 214 may extend through a plurality of pairs each including a conductor layer 206 and a dielectric layer 208 (referred to herein as "conductor/dielectric layer pairs"). The number of the conductor/dielectric layer pairs in memory stack 204 (e.g., 32, 64, 96, or 128) determines the number of memory cells in 3D memory device 200. Memory stack 204 can include a plurality of interleaved conductor layers 206 and dielectric layers 208. Conductor layers 206 and dielectric layers 208 in memory stack 204 can alternate in the vertical direction. Conductor layers 206 can include conductive materials including, but not limited to, tungsten (W), cobalt (Co), copper (Cu), aluminum (Al), polysilicon, doped silicon, silicides, or any combination thereof. Dielectric layers 208 can include dielectric materials including, but not limited to, silicon oxide, silicon nitride, silicon oxynitride, or any combination thereof. The numbers of conductor/dielectric layer pairs in each of lower and upper memory decks 204A and 204B can be the same or different.

As shown in FIG. 2, 3D memory device 200 may also include a semiconductor plug 216 at the lower end of lower channel structure 212 and a channel plug 218 at the upper end of upper channel structure 214. As used herein, the "upper end" of a component is the end farther away from substrate 202 in the y-direction, and the "lower end" of the component is the end closer to substrate 202 in the y-direction when substrate 202 is positioned in the lowest plane of 3D memory device 200.

In some embodiments, as the connection between lower channel structure 212 and upper channel structure 214, lower channel structure 212 includes an inter-deck plug 210 in its upper portion. Lower channel structure 212 further includes a lower memory film 226 and a lower semiconductor channel 227 along its sidewall. Similarly, upper channel structure 214 includes an upper memory film 228 and an upper semiconductor channel 229 along its sidewall. Each of memory films 226 and 228 may include a tunneling layer, a storage layer (also known as a "charge trap layer"), and a blocking layer (not shown). Semiconductor channel 227 and memory film 226 may arrange radially from the center toward the outer surface of the pillar in this order, according to some embodiments. The same arrangement may also apply to upper semiconductor channel 229 and upper memory film 228.

Consistent with some embodiments, lower channel structure 212 and upper channel structure 214 can each be in contact with inter-deck plug 210 on its opposite sides and thus, can be electrically connected by inter-deck plug 210. Lower channel structure 212 and upper channel structure 214 can be electrically connected to semiconductor plug 216 and channel plug 218, respectively.

According to the present disclosure, lower memory deck 204A of memory stack 204 may further include a high-κ dielectric layer 232 formed above substrate 202. High-κ refers to a material with a high dielectric constant κ. In the semiconductor industry, high-κ usually has the meaning that the dielectric constant κ of the material is higher than that of silicon dioxide, which is 3.9. Examples of high-κ materials that may be used as high-κ dielectric layer 232 in the embodiments according to the present disclosure may include, but not limited to, hafnium dioxide ($HfO_2$), tantalum pentoxide ($Ta_2O_5$), titanium dioxide ($TiO_2$), silicon oxynitride ($SiO_xN_y$), or any combination thereof. Compared to the traditional silicon dioxide, a high-κ material may be used to provide a thinner layer above the substrate while achieving superior gate capacitance and decreased leakage effects. In some embodiments, the thickness of the high-κ dielectric layer according to the present disclosure may be between about 5 nm to about 50 nm (e.g., 5 nm, 10 nm, 15 nm, 20 nm, 25 nm, 30 nm, 35 nm, 40 nm, 45 nm, 50 nm, any range bounded by the lower end by any of these values, or in any range defined by any two of these values). This is significantly thinner than using a silicon oxide layer, which usually has a thickness between 100 nm and 150 nm.

High-κ dielectric layer 232 according to the present disclosure may laterally cover the entire upper surface of substrate 202. Alternatively, it may also laterally cover only part of the upper surface of substrate 202 (for example, at and surround areas where lower memory deck 204A extends above substrate 202).

In some embodiments, the material of high-κ dielectric layer 232 according to the present disclosure does not necessarily have to be homogeneous across the entire layer. The material may be different at various regions while achieving the same purpose of reducing leakage and improving electrical connection. In other embodiments, more than one high-κ dielectric layer may be vertically stacked above substrate 202 in order to collectively form high-κ dielectric layer 232. When more than one high-κ dielectric layers are stacked, the thickness of such a combined high-κ dielectric layer 232 may be between about 30 nm and about 100 nm (e.g., 30 nm, 40 nm, 50 nm, 60 nm, 70 nm, 80 nm, 90 nm, 100 nm, any range bounded by the lower end by any of these values, or in any range defined by any two of these values).

Consistent with embodiments according to the present disclosure, high-κ dielectric layer may be formed by one or more thin-film deposition processes, including, but not limited to, chemical vapor deposition (CVD), physical vapor deposition (PVD), atomic layer deposition (ALD), thermal oxidation, electroplating, electroless plating, or any combinations thereof. In some embodiments, ALD may be preferably used in which a film is grown on a substrate by exposing its surface to alternate gaseous species (typically referred to as precursors). ALD process has the advantage of forming the high-κ dielectric layer with high uniformity and precision across the surface of the substrate.

As shown in FIG. 2, a plurality of interleaved conductor layers 206 and dielectric layers 208 may be positioned above high-κ dielectric layer 232 in lower memory deck 204A of memory stack 204. These conduct/dielectric layer pairs can be formed by alternatingly depositing different materials that respectively make conductor layer 206 and dielectric layer 208.

In some embodiments, an insulation layer (not shown in FIG. 2) may be optionally formed between substrate 202 and high-κ dielectric layer 232 by depositing dielectric materials, such as silicon oxide, or by thermal oxidation, on the silicon substrate prior to the formation of memory stack 204. This optional insulation layer may further prevent leakage between the gate of transistors and substrate 202.

As shown in FIG. 2, embodiments according to the present disclosure further disclose semiconductor plug 216 at the lower end of lower channel structure 212. It is understood that in some embodiments, semiconductor plug 216 can include polysilicon that is disposed in an opening of high-κ dielectric layer 232. Semiconductor plug 216 may be formed by one or more thin-film deposition processes over silicon substrate 302, including, but not limited to, CVD, PVD, ALD, thermal oxidation, electroplating, electroless plating, or any combinations thereof. Thus, the resulted semiconductor plug 216 distinguishes from conventional semiconductor plug 116 both in terms of the material and the location. More specifically, semiconductor plug 216 is formed without using the SEG process so that it includes polysilicon as opposed to single crystalline silicon found in substrate 202 and conventional semiconductor plug 116. Furthermore, semiconductor plug 216 is disposed above substrate 202, as opposed to conventional semiconductor plug 216 being partially embedded in substrate 202 due to the SEG process.

Semiconductor plug 216 can function as a channel controlled by a source select gage of lower channel structure 212. The opening may be created by etching high-κ dielectric layer 232 using wet etching fabrication processes, which employ liquid-phase etchants, such as hydrofluoric (HF) acid or other suitable liquid-phase etchants as long as the opening may be etched. The part of high-κ dielectric layer 232 that is not etched may remain in 3D memory device 200, as shown in FIG. 2.

In some embodiments, semiconductor plug 216 may be in contact with lower memory film 226 to electrically connect semiconductor plug 216 with lower channel structure 212. The contact area may be the entire upper surface of semiconductor plug 216, or just a partial portion of the upper surface of semiconductor plug 216.

In embodiments where a multi-deck 3D memory device is used, one or more high-κ dielectric layers may be provided between two decks. Using FIG. 2 as an example, 3D memory device 200 has a dual-deck structure that includes lower memory deck 204A and upper memory deck 204B. After lower memory deck 204A is fabricated, a high-κ dielectric layer 234 may be formed above lower memory deck 204A, using the same fabrication processes as the formation of high-κ dielectric layer 232, such as Atomic Layer Deposition (ALD). A plurality of interleaved conductor layers 206 and dielectric layers 208 may be positioned above high-κ dielectric layer 234 in upper memory deck 204B of memory stack 204. These conduct/dielectric layer pairs can be formed by alternatingly depositing different materials that respectively make conductor layer 206 and dielectric layer 208.

In some embodiments, similar to the opening in high-κ dielectric layer 232, an opening may be created in high-κ dielectric layer 234 by, for example, wet etching processes, so that an inter-deck plug 210 may be formed that allows contact between lower memory film 226 and upper memory film 228. Since high-κ dielectric layer 232 is used instead of the conventional joint oxide layer, the risk of etching through inter-deck plug 210 by subsequent fabrication processes is significantly reduced, and therefore the "gouging" process may no longer be needed, according to the present disclosure.

High-κ dielectric layer 234 may include the same material as high-κ dielectric layer 232. Alternatively, part or all of high-κ dielectric layer 234 may include a material different from high-κ dielectric layer 232. The materials may be one or more of $HfO_2$, $Ta_2O_5$, $TiO_2$, $SiOXN_y$, or any combination thereof.

Similar to high-κ dielectric layer 232, high-κ dielectric layer 234 may have a thickness between about 5 nm and about 50 nm (e.g., 5 nm, 10 nm, 15 nm, 20 nm, 25 nm, 30 nm, 35 nm, 40 nm, 45 nm, 50 nm, any range bounded by the lower end by any of these values, or in any range defined by any two of these values). In some embodiments, high-κ dielectric layer 234 may laterally cover the entire upper surface of lower memory deck 204A. Alternatively, it may also laterally cover only part of the upper surface of lower memory deck 204A (for example, at and surround areas where upper memory deck 204B extends above lower memory deck 204A).

In some embodiments, the material of high-κ dielectric layer 234 does not necessarily have to be homogeneous across the entire layer. The material may be different at various regions while achieving the same purpose of reducing leakage and improving electrical connection. In other embodiments, more than one high-κ dielectric layer may be vertically stacked above lower memory deck 204A in order to collectively form high-κ dielectric layer 234. When more than one high-κ dielectric layers are stacked, the thickness of such a combined high-κ dielectric layer 234 may be between about 30 nm and about 100 nm (e.g., 30 nm, 40 nm, 50 nm, 60 nm, 70 nm, 80 nm, 90 nm, 100 nm, any range bounded by the lower end by any of these values, or in any range defined by any two of these values). In further embodiments, an insulation layer (not shown in FIG. 2) may be optionally formed between lower memory deck 204A and high-κ dielectric layer 232 by depositing dielectric materials, such as silicon oxide, or by thermal oxidation, on the silicon substrate prior to the formation of upper memory deck 204B. This optional insulation layer may further prevent leakage between the gate of transistors and inter-deck plug 210.

Embodiments according to the present disclosure provide one or more high-κ dielectric layers in a 3D memory device, which may function as an etch stop layer during the fabrication process of the memory device. This may reduce the film thickness and increase the overall uniformity as compared to conventional silicon oxide layer, therefore brings the beneficial result of decreased leakage of electrons at the semiconductor plug and inter-deck plug and improved electrical connection between the substrate and the lower deck of memory string and between upper and lower decks of the memory string. It may further reduce the damage to the plugs during channel etching and save costs by getting rid of the gouging and SEG processes with respect to plug formation.

Figure 3C:
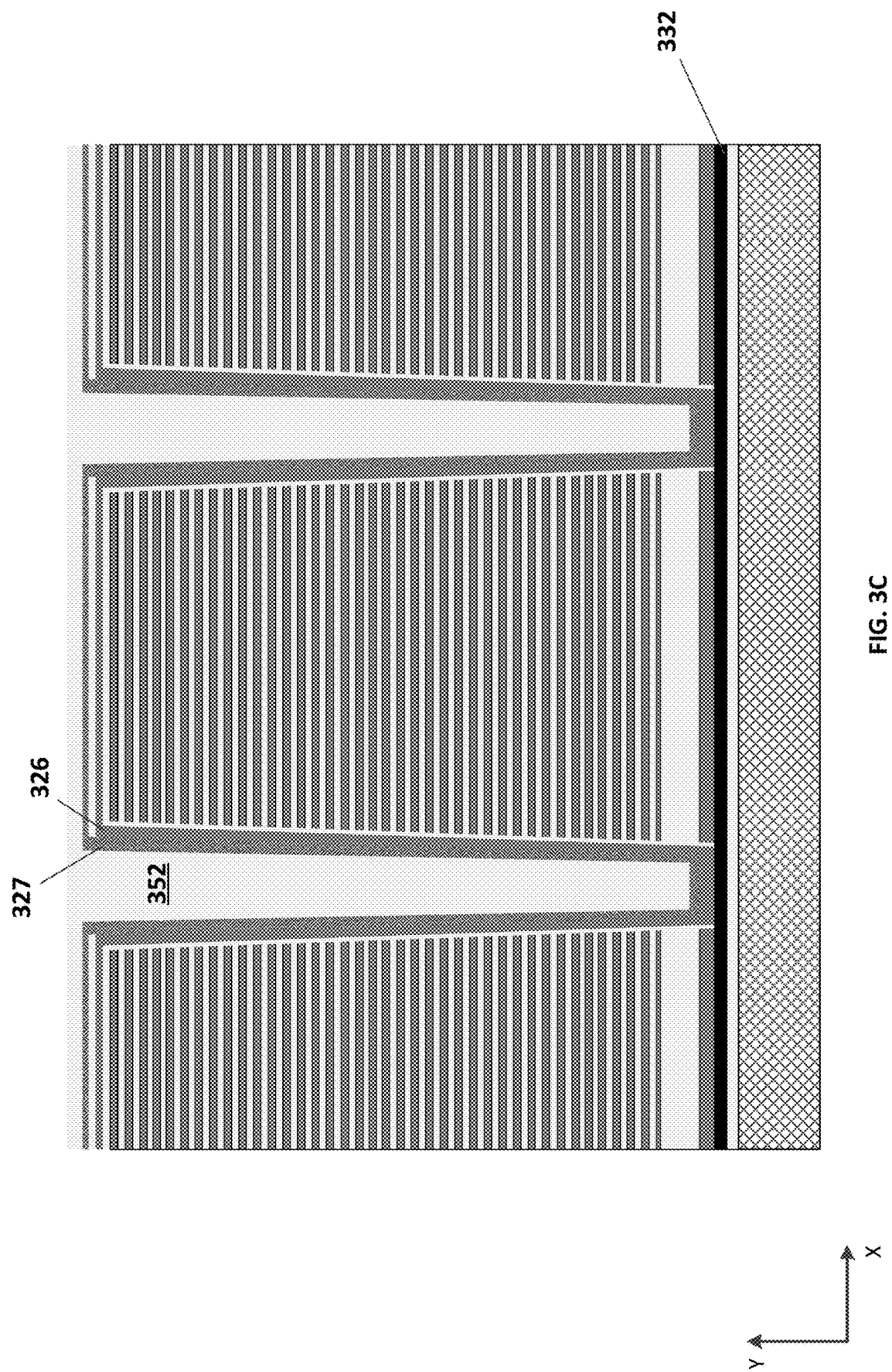
Figure 3D:
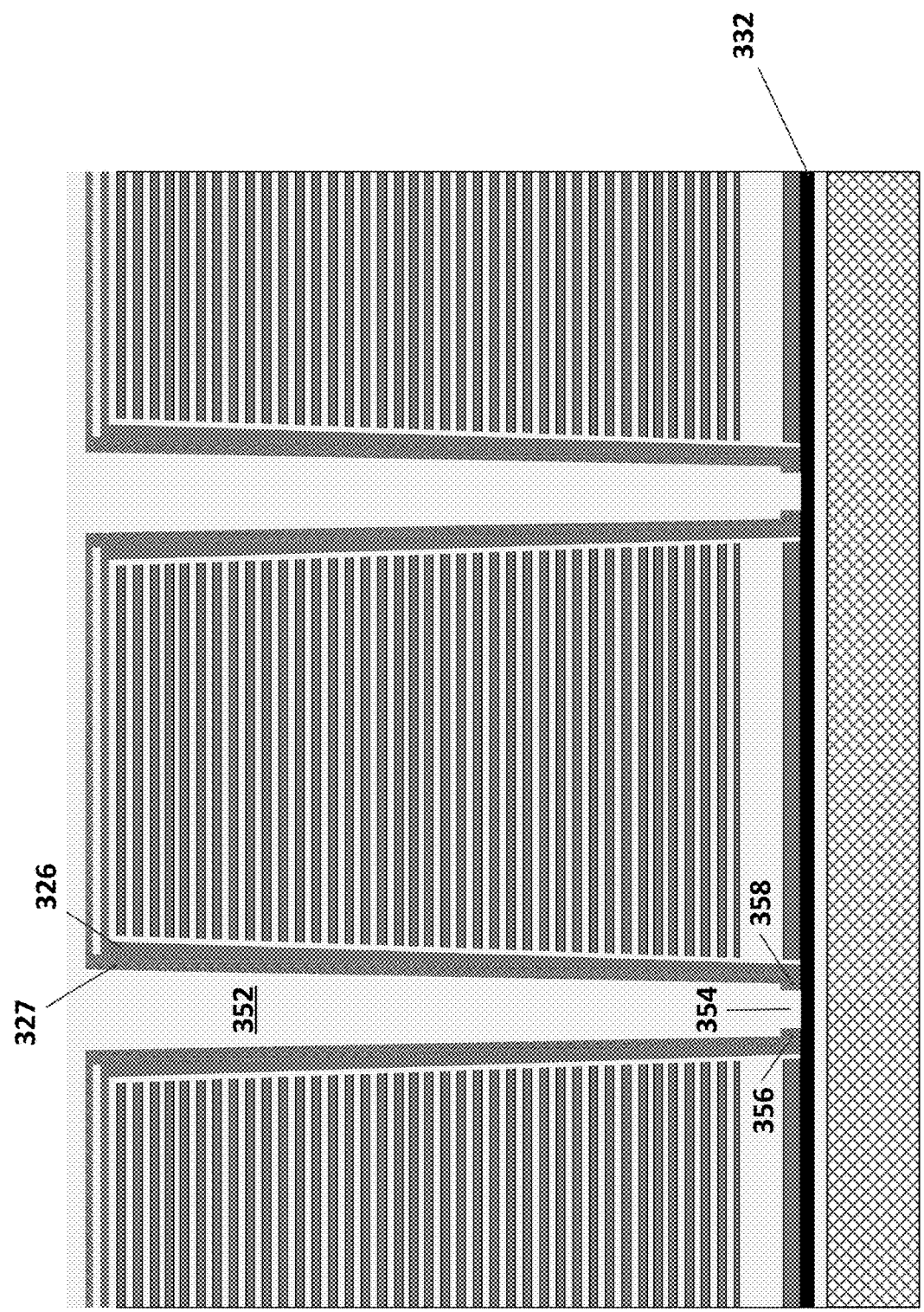
Figure 3E:
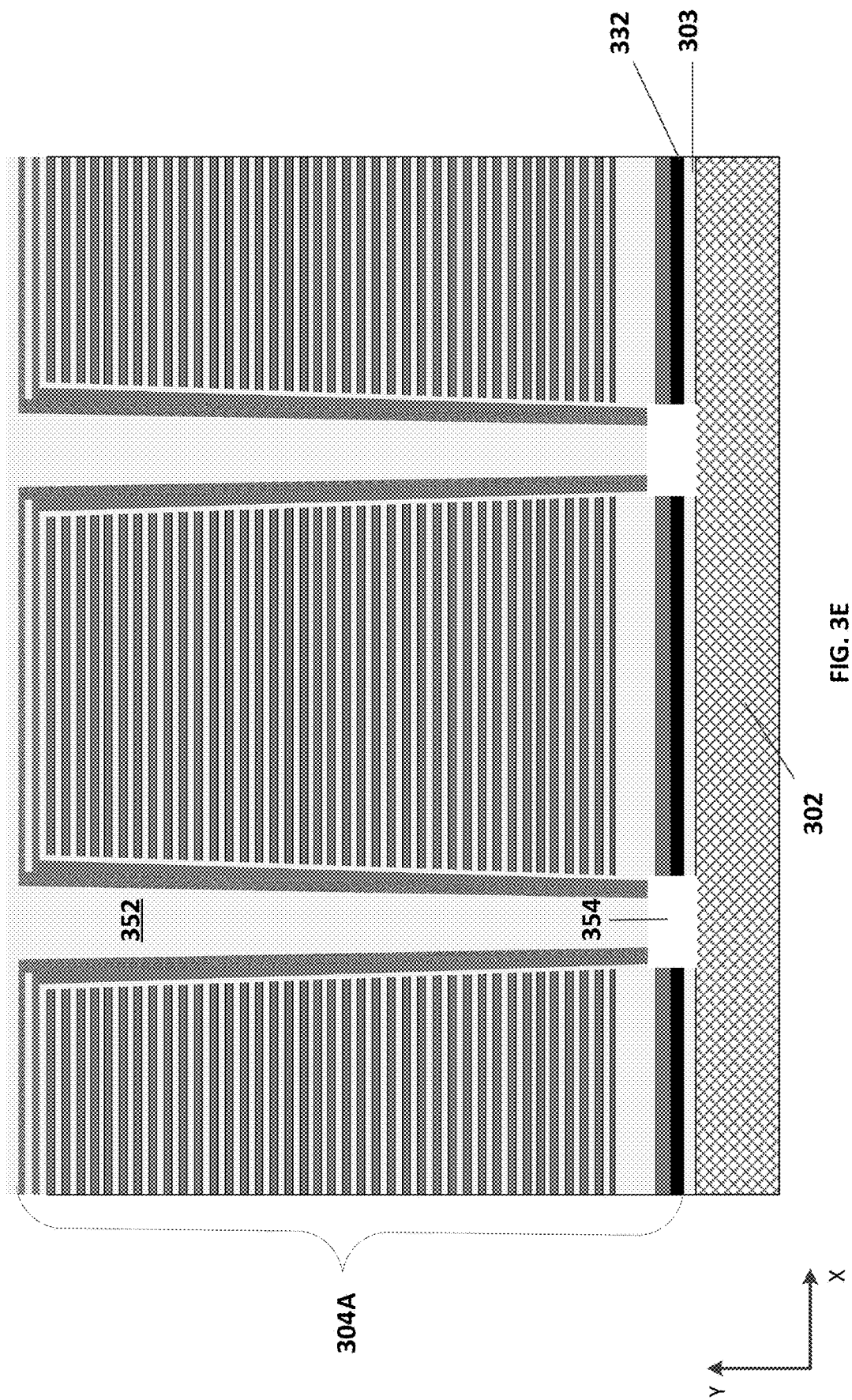
Figure 3F:
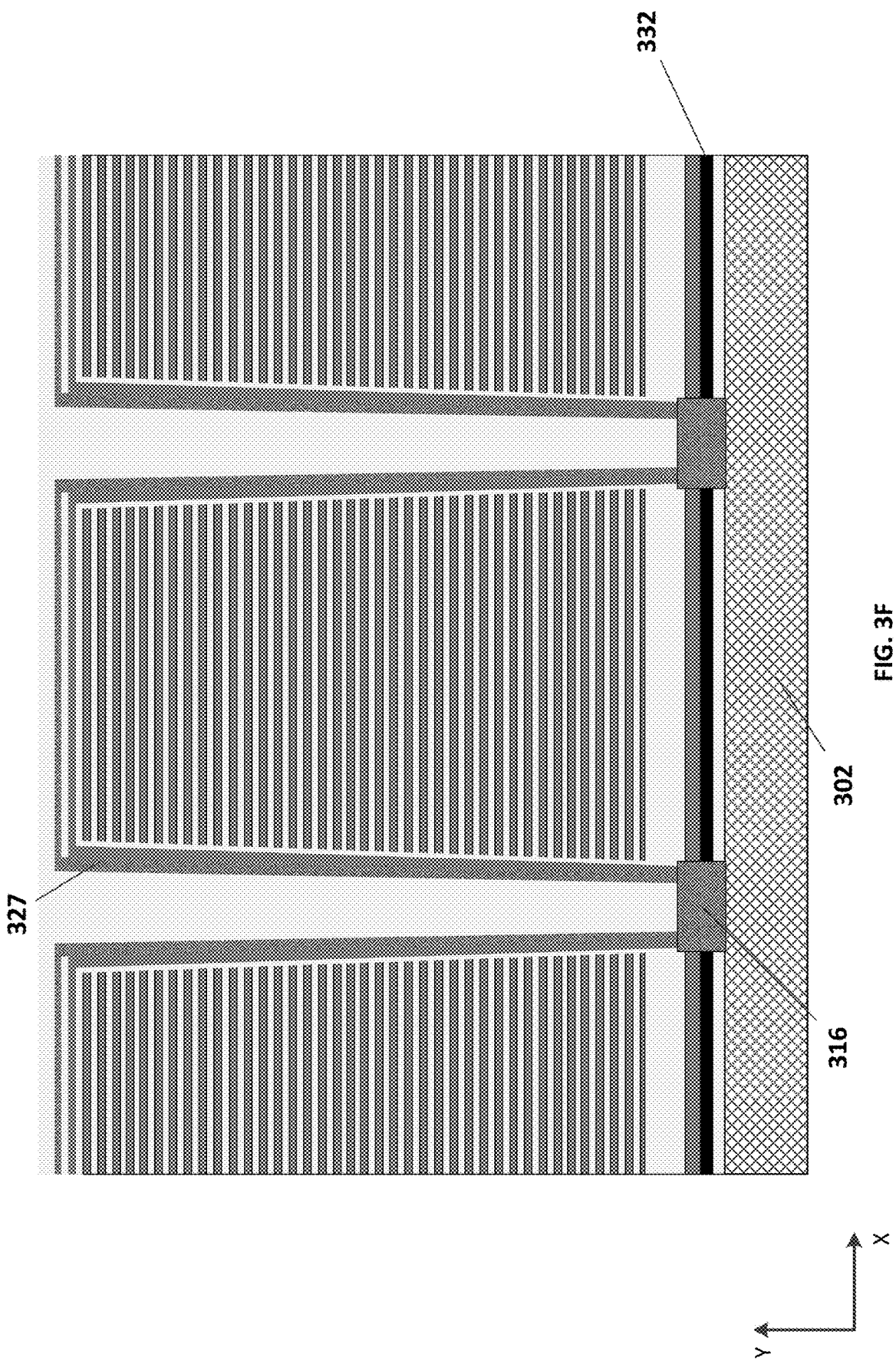
Figure 3G:
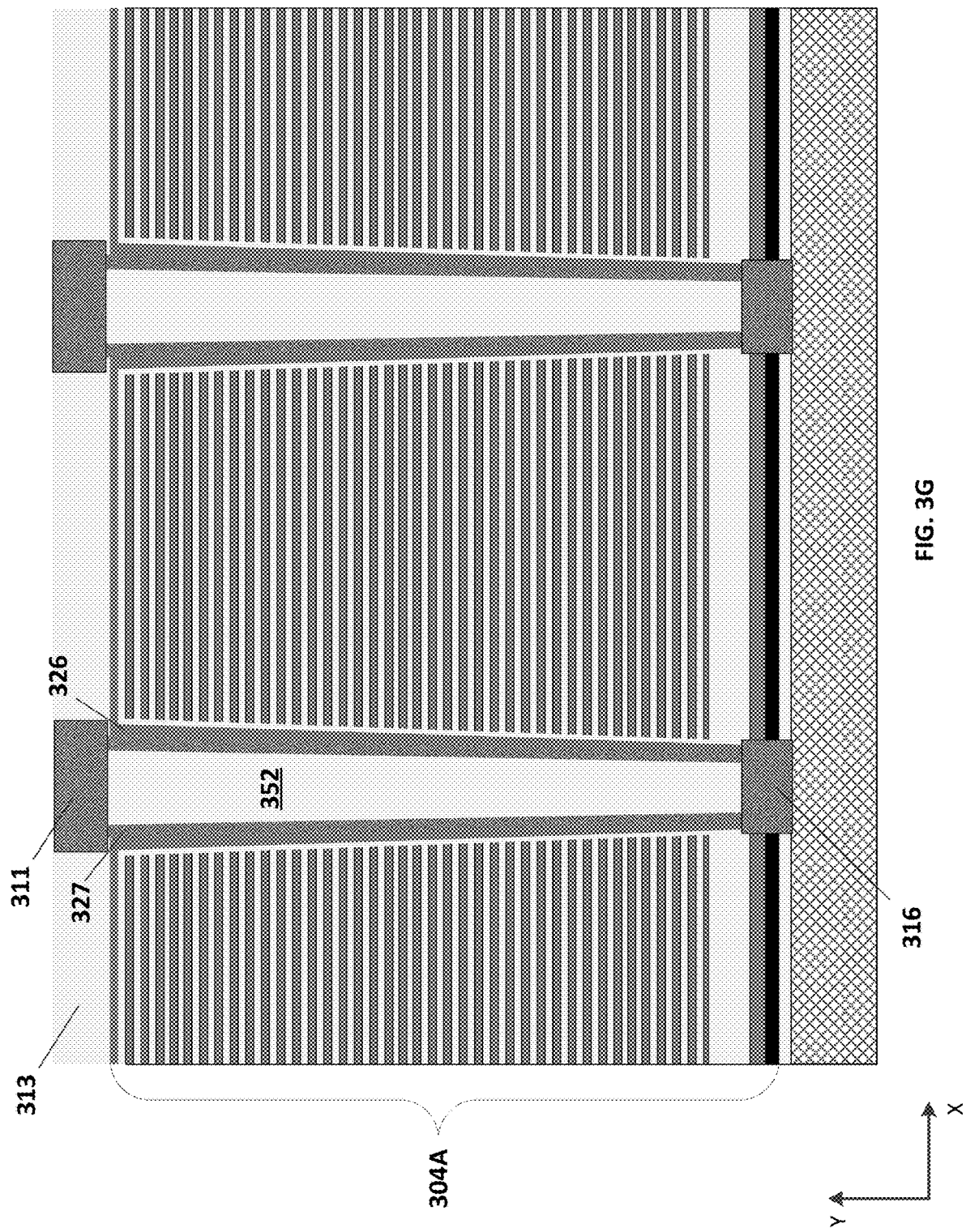
Figure 3H:
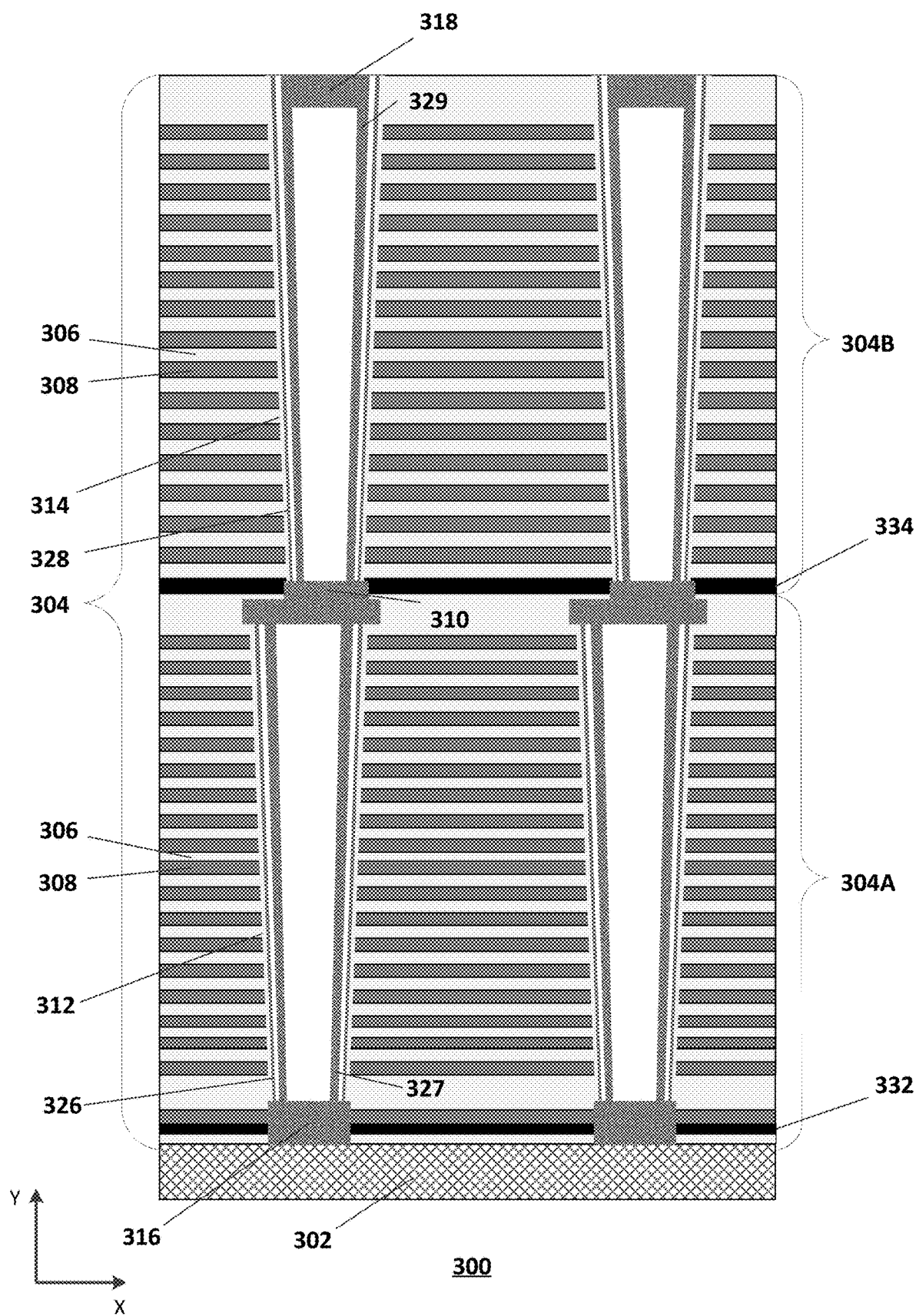
Figure 4:
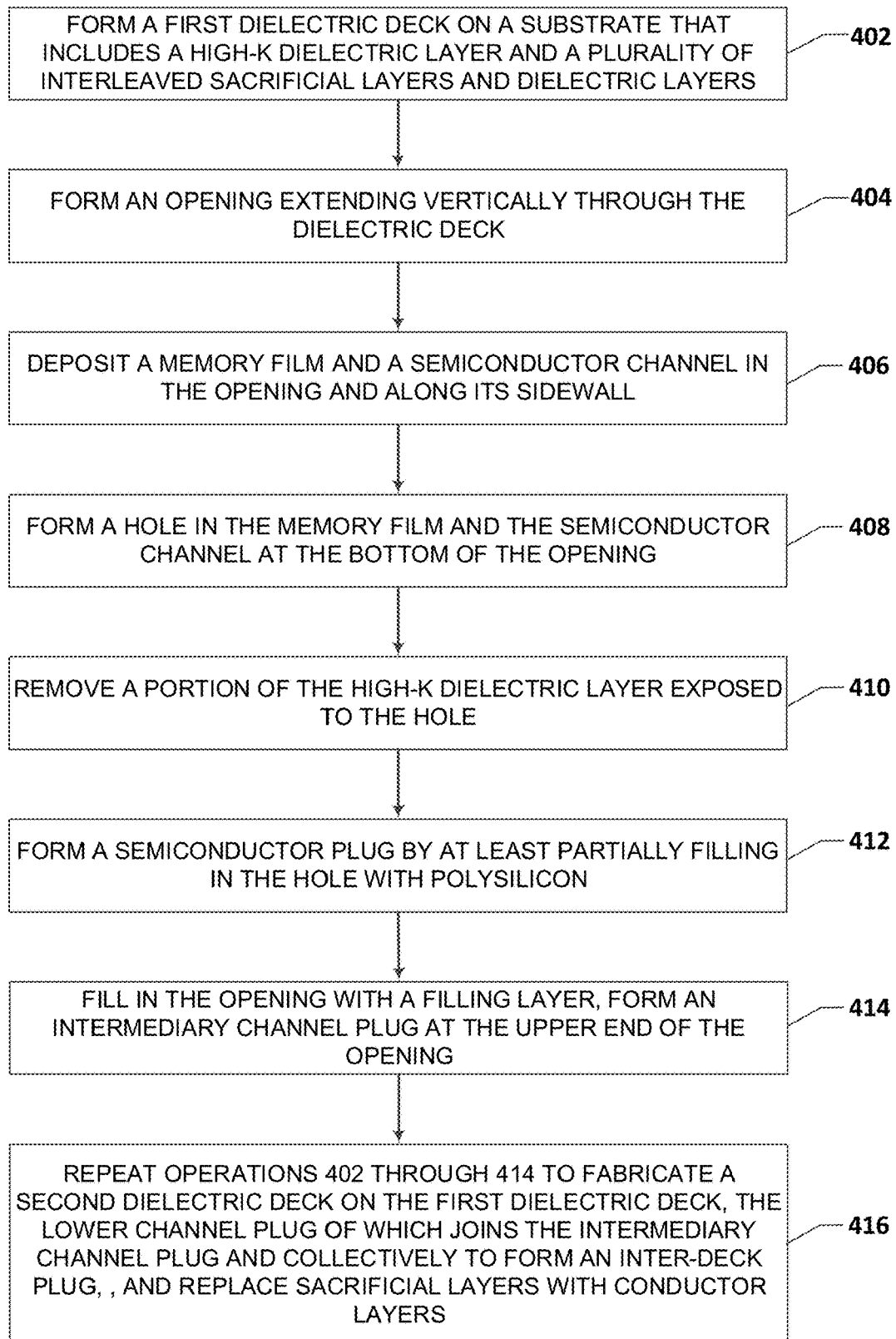
FIG. 4 illustrates a flowchart of an exemplary method for forming a 3D memory device having one or more high-κ dielectric layers, according to some embodiments of the present disclosure.

FIGS. 3A-3H illustrate an exemplary fabrication process for forming a 3D memory device having one or more high-κ dielectric layers, according to some embodiments of the present disclosure. FIG. 4 illustrate a flowchart of an exemplary method 400 for forming a 3D memory device having one or more high-κ dielectric layer, according to some embodiments of the present disclosure. Examples of the 3D memory device depicted in FIGS. 3A-3H and FIG. 4 include 3D memory device 200 depicted in FIG. 2. FIGS. 3A-3H and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a dielectric deck is formed on a substrate. The substrate can be a silicon substrate. The dielectric deck can include a high-κ dielectric layer and a plurality of interleaved sacrificial layers and dielectric layers. Referring to FIG. 3A, a lower dielectric deck 304A including a high-κ dielectric layer 332 and a plurality pairs of a dielectric layer 306 and a dielectric layer (known as a "sacrificial layer") 308 (together referred to herein as "dielectric layer pairs") is formed on a silicon substrate 302. In some embodiments, an insulation layer 303 may be optionally formed between lower dielectric deck 304A and silicon substrate 302 by depositing dielectric materials, such as silicon oxide, or thermal oxidation, on silicon substrate 302 prior to the formation of lower dielectric deck 304A.

Consistent with the embodiments according to the present disclosure, high-κ dielectric layer 332 may be formed by one or more thin-film deposition processes over silicon substrate 302 (or over insulation layer 303 if it exists), including, but not limited to, CVD, PVD, ALD, thermal oxidation, electroplating, electroless plating, or any combinations thereof. Preferably, ALD may be used to expose the surface of silicon substrate 302 (or of insulation layer 303 if it exists) to alternate gaseous species (typically referred to as precursors) so that a thin film of high-κ dielectric material may be grown on silicon substrate 302 (or on insulation layer 303 if it exists). Examples of high-κ materials that may be used as high-κ dielectric layer 332 in the embodiments according to the present disclosure may include, but not limited to, $HfO_2$, $Ta_2O_5$, $TiO_2$, $SiOXN_y$, or any combination thereof. The thickness of high-κ dielectric layer 332 may be between about 5 nm to about 50 nm (e.g., 5 nm, 10 nm, 15 nm, 20 nm, 25 nm, 30 nm, 35 nm, 40 nm, 45 nm, 50 nm, any range bounded by the lower end by any of these values, or in any range defined by any two of these values).

High-κ dielectric layer 332 according to the present disclosure may be formed to laterally cover the entire upper surface of silicon substrate 302. Alternatively, it may also be formed to laterally cover only part of the upper surface of silicon substrate 302 (for example, at and surround areas where lower dielectric deck 304A extends above silicon substrate 302).

In some embodiments, the material of high-κ dielectric layer 332 according to the present disclosure does not necessarily have to be homogeneous across the entire layer. The material may be different at various regions while achieving the same purpose of reducing leakage and improving electrical connection. In other embodiments, more than one high-κ dielectric layer may be vertically stacked above silicon substrate 302 in order to collectively form high-κ dielectric layer 332. When more than one high-κ dielectric layers are stacked, the thickness of such a combined high-κ dielectric layer 332 may be between about 30 nm and about 100 nm (e.g., 30 nm, 40 nm, 50 nm, 60 nm, 70 nm, 80 nm, 90 nm, 100 nm, any range bounded by the lower end by any of these values, or in any range defined by any two of these values).

According to the present disclosure, lower dielectric deck 304A includes interleaved sacrificial layers 308 and dielectric layers 306, according to some embodiments. Dielectric layers 306 and sacrificial layers 308 can be alternatively deposited on high-κ dielectric layer 332 to form lower dielectric deck 304A. In some embodiments, each dielectric layer 306 includes a layer of silicon oxide, and each sacrificial layer 308 includes a layer of silicon nitride. Lower dielectric deck 304A can be formed by one or more thin film deposition processes including, but not limited to, CVD, PVD, ALD, or any combination thereof.

Method 400 proceeds to operation 404, as illustrated in FIG. 4, in which an opening extending vertically through the dielectric deck up to the high-κ dielectric layer is formed. As illustrated in FIG. 3B, an opening 352 is formed extending vertically through lower dielectric deck 304A until it reaches high-κ dielectric layer 332, which may serve as an etch stop layer during the during the fabrication of the 3D memory device. In some embodiments, a plurality of openings are formed through lower dielectric deck 304A such that each opening becomes the location for growing an individual NAND memory string in the later process. As shown in FIG. 3B, two of such openings are formed. In some embodiments, fabrication processes for forming opening 352 may include wet etching and/or dry etching, such as deep-ion reactive etching (DRIE).

Method 400 proceeds to operation 406, as illustrated in FIG. 4, in which a memory film and a semiconductor channel are formed. As illustrated in FIG. 3C, a memory film 326 (including a blocking layer, a storage layer, and a tunneling layer (not shown)) and a semiconductor channel 327 are formed in opening 352 and along its sidewall. In some embodiments, memory film 326 may first be deposited along the sidewall of opening 352 and on high-κ dielectric layer 332, and semiconductor channel 327 may then be deposited over memory film 326. The blocking layer, the storage layer, and the tunneling layer can be subsequently deposited in this order using one or more thin film deposition processes, such as ALD, CVD, PVD, any other suitable processes, or any combination thereof, to form memory film 326. Semiconductor channel 327 can then be formed by depositing polysilicon or any other suitable materials on the tunneling layer using one or more thin film deposition processes, such as ALD, CVD, PVD, any other suitable processes, or any combination thereof. As shown in FIG. 3C, memory film 326 and semiconductor channel 327 can cover both the bottom surface (over high-κ dielectric layer 332) and the sidewall of opening 352. In some embodiments, a silicon oxide layer, a silicon nitride layer, a silicon oxide layer, and a polysilicon layer (an "ONOP" structure) may be sequentially deposited to form memory film 326 (as the block layer, the storage layer, and the tunneling layer) and semiconductor channel 327.

Method 400 proceeds to operation 408, as illustrated in FIG. 4, in which a memory film and a semiconductor channel are formed. As illustrated in FIG. 3D, a hole 354 is formed in memory film 326 and semiconductor channel 327 at the bottom of opening 352. In some embodiments, hole 354 may be created through a manufacturing process known as "PONO" punch. "PONO" punch may be used to etch through a structure of stacked layers of materials in the sequence of polysilicon, silicon oxide, silicon nitride, and silicon oxide, which is the same sequence of materials from semiconductor channel 327 to the blocking layer, the storage layer, and the tunneling layer of memory film 326. The "PONO" punch stops at high-κ dielectric layer 332, which may serve as an etch stop layer. In some embodiments, as shown in FIG. 3D, L-shaped protrusions 356 and 358 of memory film 326 and semiconductor channel 327 may be left at one or both of the left and right bottoms of opening 352 after etching. Protrusions 356 and 358 may be further removed in the following steps.

Method 400 proceeds to operation 410, as illustrated in FIG. 4, in which wet etching may be applied to remove a portion of the high-κ dielectric layer exposed to the opening. As illustrated in FIG. 3E, wet etching process may be used to remove a portion of high-κ dielectric layer 332 that is exposed to opening 352. Wet etching employs liquid-phase etchants, such as HF acid or other suitable liquid-phase etchants. As a concrete example of wet etching process, a wafer containing lower dielectric stack 304A and silicon substrate 302 are immersed in a bath of the etchants, which in turn remove the portion of high-κ dielectric layer 332 exposed to the etchants. In some embodiments, wet etching may also remove protrusions 356 and 358 if they are left from the previous step, thereby enlarging hole 354, as shown in FIG. 3E. In other embodiments, wet etching may further remove a portion of insulation layer 303 (if it exists) that abuts the removed portion of high-κ dielectric layer 332. In further embodiments, hole 354 may extend further into the top portion of silicon substrate 302 because the wet etching process through lower dielectric deck 304A may not stop at the top surface of silicon substrate 302 and may continue to etch part of silicon substrate 302. Alternatively, a separate etching process may be used to etch part of silicon substrate 302 after etching through lower dielectric deck 304A.

Method 400 proceeds to operation 412, as illustrated in FIG. 4, in which a semiconductor plug is formed by at least partially filling in the hole with polysilicon. As illustrated in FIG. 3F, polysilicon may be used to fill in hole 354 using one or more thin film deposition processes, such as PVD, CVD, electroplating, electroless plating, or any combinations thereof, therefore forming a semiconductor plug 316. Semiconductor plug 316 formed through deposition processes may achieve better result with respect to uniformity and gate-to-substrate leakage as compared to a plug formed by gouging and SEG processes. Semiconductor plug 316 may be in contact with semiconductor channel 327.

Method 400 proceeds to operation 414, as illustrated in FIG. 4, in which the opening is filled with a filling layer and an intermediary channel plug is formed at the upper end of the opening. As illustrated in FIG. 3G, after formation of semiconductor plug 316, the remaining unfilled spaces of opening 352 may be partially or fully filled with a filling layer that includes dielectric materials, such as silicon oxide. Opening 352 may have a cylinder shape (e.g., a pillar shape). Opening 352, semiconductor channel 327, and memory film 326 may be arranged radially from the center toward the outer surface of the pillar in this order, according to some embodiments.

In some embodiments according to the present disclosure, a joint oxide layer 313 may be formed on top of the surface of lower dielectric deck 304A. It may be formed simultaneously with the filling layer of opening 352, or alternatively separately formed subsequent to the formation of the filling layer. It is understood that a portion of joint oxide layer 313 abutting opening 352 may be removed so that an intermediary channel plug 311 may be formed at the place where the joint oxide layer 313 is partially removed, as shown in FIG. 3G. The removal may be performed by, for example, wet etching and/or dry etching.

Consistent with some embodiments, the intermediary channel plug 311 may be formed by, for example, depositing polysilicon in the hole created after removal of joint oxide layer 313. Intermediary channel plug 311 is in contact with semiconductor channel 327 so that a path for electrons to flow between intermediary channel plug 311 and semiconductor plug 316 can be created. Subsequently, the top surface of lower dielectric deck 304A may be planarized by chemical mechanical polishing (CMP), wet etching, and/or dry etching, such that the top surface of the intermediary channel plug 311 becomes flush with the top surface of lower dielectric deck 304A.

Method 400 proceeds to operation 416, as illustrated in FIG. 4, in which operations 402 through 414 are repeated to fabricate a second dielectric deck, which includes a lower channel plug that joins the intermediary channel plug of the first dielectric deck to form an inter-deck plug. As illustrated in FIG. 3H, a lower dielectric deck 304B may be formed by repeating operations 402 through 414 discussed above. For the sake of brevity, only the differences between forming lower dielectric deck 304A and upper dielectric deck 304B will be elaborated herein.

Since no substrate is needed for upper dielectric deck 304B, a second high-κ dielectric layer 334 may be formed over lower dielectric deck 304A without a substrate in-between. After a portion of second high-κ dielectric layer 334 is removed, a semiconductor plug at the bottom of upper dielectric deck 304B may be formed on top of intermediary channel plug 311. Since intermediary channel plug 311 and the semiconductor plug both include polysilicon as its material, the two plugs may be conjoined to form inter-deck plug 310, as shown in FIG. 3H. Similar to forming the first memory deck from lower dielectric deck 304A, a second memory deck may be formed by replacing sacrificial layers 308 in upper dielectric deck 304B with conductor layers. Therefore, a dual-deck memory stack using high-κ dielectric layers as etch stop layers may be obtained with the above operations.

In FIG. 3H, a 3D memory device 300 is shown with various parts and components indicated by numerals corresponding to those in FIG. 2. For example, 3D memory device 300 may include one or more of the following: a substrate 302, a memory stack 304 having a lower memory deck 304A and an upper memory deck 304B, a first high-κ dielectric layer 332, a second high-κ dielectric layer 334, a plurality of interleaved conductor layers 306 and dielectric layers 308, a semiconductor plug 316, an inter-deck plug 310, a channel plug 318, a lower channel structure 312, an upper channel structure 314, a lower memory film 326, an upper memory film 328, a lower semiconductor channel 327, and an upper semiconductor channel 329.

Although not illustrated, it is understood that after the formation of the lower and upper dielectric decks 304A and 304B as shown in FIGS. 3A-3H, a memory deck can be formed by replacing sacrificial layers 308 in lower and upper dielectric decks 304A and 304B with conductor layers. The memory deck thus can include a plurality of conductor/dielectric layer pairs. In some embodiments, to form the memory deck, a slit opening (e.g., a gate line slit) can be formed through lower and upper dielectric decks 304A and 304B, sacrificial layers 308 in lower and upper dielectric decks 304A and 304B can be etched by applying the etchants through the slit opening to form a plurality of lateral recesses, and the conductor layers can be deposited in the lateral recesses. It is further understood that, in some other embodiments where a single-deck memory stack is provided, the same replacement of sacrificial layers with conductor layers may be also applied to the single-deck memory stack after formation of the dielectric deck in the memory stack. Likewise, for memory stacks with three or more dielectric decks, the same replacement process may be applied after all dielectric decks are formed.

Embodiments according to the present disclosure provide a method for forming a 3D memory device with one or more high-κ dielectric layers, which may function as an etch stop layer during the fabrication process of the memory device. This may reduce the film thickness and increase the overall uniformity as compared to conventional silicon oxide layer, therefore brings the beneficial result of decreased leakage of electrons at the semiconductor plug and inter-deck plug and improved electrical connection between the substrate and the lower deck of memory string and between upper and lower decks of the memory string. It may further reduce the damage to the plugs during channel etching and save costs by getting rid of the gouging and SEG processes with respect to plug formation.

According to one aspect of the present disclosure, a 3D memory device includes a substrate, a memory deck including a first high-κ dielectric layer above the substrate and a first plurality of interleaved conductor layers and dielectric layers above the first high-κ dielectric layer, and a semiconductor plug disposed above the substrate and in an opening of the first high-κ dielectric layer.

In some embodiments, the 3D memory device further includes a first channel structure extending vertically above the semiconductor plug and through the memory stack. The first channel structure includes a first memory film above the first high-κ dielectric layer and along a sidewall of the first channel structure. The first memory film is in contact with the semiconductor plug.

In some embodiments, the 3D memory device further includes a second channel structure extending vertically above the first memory string and through the memory stack, a second high-κ dielectric layer disposed between the first channel structure and the second channel structure, and an inter-deck plug disposed in an opening of the second high-κ dielectric layer.

In some embodiments, the 3D memory device further includes a second memory film above the second high-κ dielectric layer and along a sidewall of the second channel structure, said second memory film being in contact with the inter-deck plug.

In some embodiments, each of the first and second high-κ dielectric layers has a dielectric constant κ higher than that of silicon dioxide.

In some embodiments, each of the first and second high-κ dielectric layers includes one or more of hafnium dioxide, tantalum pentoxide, titanium dioxide, or silicon oxynitride.

In some embodiments, the semiconductor plug comprises polysilicon.

In some embodiments, at least one of the first and second high-κ dielectric layers is prepared by ALD.

In some embodiments, a thickness of each of the first and second high-κ dielectric layers is between about 5 nm and about 50 nm.

In some embodiments, at least one of the first and second high-κ dielectric layers includes two or more layers vertically stacked above the substrate, and each of the two or more layers is a high-κ dielectric layer. A thickness of each of the first and second high-κ dielectric layers in these embodiments is between about 30 nm and about 100 nm.

In some embodiments, the opening of at least one of the first and second high-κ dielectric layers is etched by wet etching.

In some embodiments, the 3D memory device further includes an insulation layer between the first high-κ dielectric layer and the substrate.

In some embodiments, the 3D memory device further includes an insulation layer between the second high-κ dielectric layer and a lower channel structure.

According to another aspect of the present disclosure, a method for forming a 3D memory device is disclosed. A first dielectric deck including a first high-κ dielectric layer above a substrate and a first plurality of interleaved sacrificial layers and dielectric layers above the first high-κ dielectric layer is formed above the substrate. A first opening in the first dielectric deck extending vertically through the first dielectric deck is formed. A first hole in the first memory film and the first semiconductor channel at the bottom of the first opening is formed, and the first hole exposes the first high-κ dielectric layer. A portion of the first high-κ dielectric layer exposed to the first hole is removed. A first semiconductor plug is formed in the first hole. A channel plug is formed at the upper end of the first opening, and the channel plug contacts the first semiconductor channel. The sacrificial layers are replaced with conductor layers.

In some embodiments, a second dielectric deck is formed over the first dielectric deck. The second dielectric deck includes a second high-κ dielectric layer above the substrate, and a second plurality of interleaved sacrificial layers and dielectric layers above the second high-κ dielectric layer. A second opening in the second dielectric deck extending vertically through the second dielectric deck is formed. A second memory film and a second semiconductor channel are formed in the second opening and along a sidewall of the second opening. A second hole is formed in the second memory film and the second semiconductor channel at the bottom of the second opening. The second hole exposes the second high-κ dielectric layer. A portion of the second high-κ dielectric layer exposed to the second hole is removed. A second semiconductor plug in the second hole is formed. The second semiconductor plug conjoins the channel plug to form an inter-deck plug. The second opening is filled in with a second filling layer. A third semiconductor plug is formed at the upper end of the second opening. The sacrificial layers are replaced with conductor layers.

In some embodiments, each of the first and second high-κ dielectric layers has a dielectric constant κ higher than that of silicon dioxide.

In some embodiments, each of the first and second high-κ dielectric layers includes one or more of hafnium dioxide, tantalum pentoxide, titanium dioxide, or silicon oxynitride.

In some embodiments, the first semiconductor plug is formed above the substrate.

In some embodiments, the first semiconductor plug comprises polysilicon.

In some embodiments, a top surface of one or both of the first and second dielectric decks is planarized.

In some embodiments, at least one of the first and second high-κ dielectric layers is prepared by ALD.

In some embodiments, a thickness of each of the first and second high-κ dielectric layers is between about 5 nm and about 50 nm.

In some embodiments, at least one of the first and second high-κ dielectric layers includes two or more layers vertically stacked above the substrate, and each of the two or more layers is a high-κ dielectric layer. A thickness of each of the first and second high-κ dielectric layers in these embodiments is between about 30 nm and about 100 nm.

In some embodiments, at least one of the first and second holes is formed by wet etching.

In some embodiments, an insulation layer is formed between the first high-κ dielectric layer and the substrate.

In some embodiments, an insulation layer is formed between the second high-κ dielectric layer and the top surface of the first dielectric deck.

According to another aspect of the present disclosure, a 3D memory device includes a substrate, a first memory deck above the substrate having a first plurality of interleaved conductor layers and dielectric layers and a first channel structure, a high-κ dielectric layer above the first memory deck, a second memory deck above the high-κ dielectric layer having a second plurality of interleaved conductor layers and dielectric layers and a second channel structure, and a semiconductor plug disposed at least partially in an opening of the high-κ dielectric layer and between the first memory deck and the second memory deck.

In some embodiments, the 3D memory device further includes a first memory film formed in the first channel structure and along a sidewall of the first channel structure, and a second memory film formed in the second channel structure and along a sidewall of the second channel structure. The semiconductor plug is electronically connected with both the first memory film and the second memory film.

In some embodiments, the high-κ dielectric layer has a dielectric constant κ higher than that of silicon dioxide.

In some embodiments, the high-κ dielectric layer includes one or more of hafnium dioxide, tantalum pentoxide, titanium dioxide, or silicon oxynitride.

In some embodiments, the semiconductor plug includes polysilicon.

In some embodiments, the high-κ dielectric layer is prepared by ALD.

In some embodiments, a thickness of the high-κ dielectric layer is between about 5 nm and about 50 nm.

In some embodiments, the high-κ dielectric layer includes two or more layers vertically stacked above the substrate, and each of the two or more layers is a high-κ dielectric layer. A thickness of the high-κ dielectric layer in these embodiments is between about 30 nm and about 100 nm.

In some embodiments, the opening of the high-κ dielectric layer is etched by wet etching.

In some embodiments, the 3D memory device further includes an insulation layer between the high-κ dielectric layer and the first memory deck.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a substrate;

a memory stack comprising:
  a first high-κ dielectric layer above the substrate, and
  a plurality of interleaved conductor layers and dielectric layers above the first high-κ dielectric layer; and
a semiconductor plug disposed with a lowest surface of the semiconductor plug directly contacting a highest surface of the substrate and in an opening of the first high-κ dielectric layer.

2. The 3D memory device of claim 1, further comprising a first channel structure extending vertically above the semiconductor plug and through the memory stack, the first channel structure comprising:
  a first memory film above the first high-κ dielectric layer and along a sidewall of the first channel structure, said first memory film being in contact with the semiconductor plug.

3. The 3D memory device of claim 2, further comprising:
  a second channel structure extending vertically above the first channel structure and through the memory stack,
  a second high-κ dielectric layer disposed between the first channel structure and the second channel structure; and
  an inter-deck plug disposed in an opening of the second high-κ dielectric layer.

4. The 3D memory device of claim 3, further comprising:
  a second memory film above the second high-κ dielectric layer and along a sidewall of the second channel structure, said second memory film being in contact with the inter-deck plug.

5. The 3D memory device of claim 3, wherein each of the first and second high-κ dielectric layers has a dielectric constant κ higher than that of silicon dioxide.

6. The 3D memory device of claim 5, wherein each of the first and second high-κ dielectric layers comprises one or more of hafnium dioxide, tantalum pentoxide, titanium dioxide, or silicon oxynitride.

7. The 3D memory device of claim 1, where the semiconductor plug comprises polysilicon.

8. The 3D memory device of claim 3, wherein at least one of the first and second high-κ dielectric layers is prepared by Atomic Layer Deposition (ALD).

9. The 3D memory device of claim 3, wherein at least one of the first and second high-κ dielectric layers comprises two or more layers vertically stacked above the substrate, and wherein each of the two or more layers is a high-κ dielectric layer.

10. The 3D memory device of claim 3, wherein the opening of at least one of the first and second high-κ dielectric layers is etched by wet etching.

11. The 3D memory device of claim 1, further comprising an insulation layer between the first high-κ dielectric layer and the substrate.

12. The 3D memory device of claim 3, further comprising an insulation layer between the second high-κ dielectric layer and a lower channel structure.

13. A method for forming a three-dimensional (3D) memory device, comprising:
  forming a first dielectric deck on a substrate, said first dielectric deck comprising:
    a first high-κ dielectric layer above the substrate; and
    a first plurality of interleaved sacrificial layers and dielectric layers above the first high-κ dielectric layer;
      forming a first opening in the first dielectric deck extending vertically through the first dielectric deck;
      forming a first memory film and a first semiconductor channel in the first opening and along a sidewall of the first opening;
      forming a first hole in the first memory film and the first semiconductor channel at the bottom of the first opening, said first hole exposing the first high-κ dielectric layer;
      removing a portion of the first high-κ dielectric layer exposed to the first hole;
      forming a first semiconductor plug in the first hole with a lowest surface of the semiconductor plug on a highest surface of the substrate;
  filling in the first opening with a first filling layer;
  forming a channel plug at the upper end of the first opening, said channel plug contacting the first semiconductor channel; and
  replacing the sacrificial layers with conductor layers.

14. The method of claim 13, further comprising:
  forming a second dielectric deck over the first dielectric deck, said second dielectric deck comprising:
    a second high-κ dielectric layer above the substrate; and
    a second plurality of interleaved sacrificial layers and dielectric layers above the second high-κ dielectric layer;
      forming a second opening in the second dielectric deck extending vertically through the second dielectric deck;
      forming a second memory film and a second semiconductor channel in the second opening and along a sidewall of the second opening;
      forming a second hole in the second memory film and the second semiconductor channel at the bottom of the second opening, said second hole exposing the second high-κ dielectric layer;
      removing a portion of the second high-κ dielectric layer exposed to the second hole;
      forming a second semiconductor plug in the second hole, said second semiconductor plug conjoining the channel plug to form an inter-deck plug;
  filling in the second opening with a second filling layer;
  forming a third semiconductor plug at the upper end of the second opening; and
  replacing the sacrificial layers with conductor layers.

15. The method of claim 14, wherein each of the first and second high-κ dielectric layers has a dielectric constant κ higher than that of silicon dioxide.

16. The method of claim 13, wherein the first semiconductor plug is formed directly on the substrate.

17. The method of claim 14, further comprising:
  planarizing a top surface of one or both of the first and second dielectric decks.

18. The method of claim 14, wherein at least one of the first and second high-κ dielectric layers comprises two or more layers vertically stacked above the substrate, and wherein each of the two or more layers is a high-κ dielectric layer.

19. A three-dimensional (3D) memory device, comprising:
  a substrate;
  a first memory deck above the substrate comprising a first plurality of interleaved conductor layers and dielectric layers and a first channel structure;
  a high-κ dielectric layer above the first memory deck;
  a second memory deck above the high-κ dielectric layer comprising a second plurality of interleaved conductor layers and dielectric layers and a second channel structure; and
  a semiconductor plug disposed only partially in an opening of the high-κ dielectric layer and between the first memory deck and the second memory deck.

20. The 3D memory device of claim 19, further comprising:
- a first memory film formed in the first channel structure and along a sidewall of the first channel structure; and
- a second memory film formed in the second channel structure and along a sidewall of the second channel structure;
- wherein the semiconductor plug is electronically connected with both the first memory film and the second memory film.

21. A three-dimensional (3D) memory device, comprising:
- a substrate;
- a memory stack comprising:
    - a first high-κ dielectric layer above the substrate, and
    - a plurality of interleaved conductor layers and dielectric layers above the first high-κ dielectric layer;
- a semiconductor plug disposed above the substrate and in an opening of the first high-κ dielectric layer;
- a first channel structure extending vertically above the semiconductor plug and through the memory stack, the first channel structure comprising a first memory film above the first high-κ dielectric layer and along a sidewall of the first channel structure, said first memory film being in contact with the semiconductor plug;
- a second channel structure extending vertically above the first channel structure and through the memory stack;
- a second high-κ dielectric layer disposed between the first channel structure and the second channel structure;
- an inter-deck plug disposed in an opening of the second high-κ dielectric layer; and
- an insulation layer between the second high-κ dielectric layer and a lower channel structure.

* * * * *